United States Patent
Fang et al.

(10) Patent No.: US 7,433,996 B2
(45) Date of Patent: Oct. 7, 2008

(54) SYSTEM AND METHOD FOR REFRESHING RANDOM ACCESS MEMORY CELLS

(75) Inventors: Hong-Gee Fang, Hsinchu (TW); Wen-Chieh Lee, Hsinchu (TW); Wei-Chieh Wu, Hsinchu (TW)

(73) Assignee: MEMOCOM Corp., Hsin-chu (TW)

( * ) Notice: Subject to any disclaimer, the term of this patent is extended or adjusted under 35 U.S.C. 154(b) by 253 days.

(21) Appl. No.: 10/880,581

(22) Filed: Jul. 1, 2004

(65) Prior Publication Data

US 2006/0004954 A1    Jan. 5, 2006

(51) Int. Cl.
*G06F 12/00* (2006.01)

(52) U.S. Cl. ............... 711/106; 711/105; 711/163; 711/167; 711/168

(58) Field of Classification Search ............... None
See application file for complete search history.

(56) References Cited

U.S. PATENT DOCUMENTS

| | | | | |
|---|---|---|---|---|
| 4,249,247 A | * | 2/1981 | Patel | 711/106 |
| 4,549,284 A | | 10/1985 | Ikuzaki | |
| 6,028,804 A | | 2/2000 | Leung | |
| 6,412,048 B1 | * | 6/2002 | Chauvel et al. | 711/158 |
| 6,625,077 B2 | | 9/2003 | Chen | |
| 6,859,415 B2 | * | 2/2005 | Takatsuka et al. | 365/233.5 |
| 7,093,067 B2 | * | 8/2006 | Sunaga et al. | 711/106 |
| 2004/0199717 A1 | * | 10/2004 | Kanda et al. | 711/106 |

* cited by examiner

*Primary Examiner*—Reginald G. Bragdon
*Assistant Examiner*—Shawn X Gu
(74) *Attorney, Agent, or Firm*—Finnegan, Henderson, Farabow, Garrett & Dunner LLP

(57) ABSTRACT

A method for operating a memory device that comprises periodically generating a refresh request signal for performing a refresh operation, providing an access request signal for performing an access operation, performing the refresh operation if the refresh request signal occurs prior to the access request signal, and performing the access operation if the access request signal occurs prior to the refresh request signal.

9 Claims, 6 Drawing Sheets

SYSTEM AND METHOD FOR REFRESHING RANDOM ACCESS MEMORY CELLS

FIELD OF THE INVENTION

This invention pertains in general to a memory device and more particularly, to a system and method for refreshing a random access memory device.

BACKGROUND OF THE INVENTION

Random access memory ("RAM") devices are used as storage devices in various applications such as computer systems, mobile phones, and video systems. Dynamic RAMs (DRAMs) and static RAMs (SRAMs) are two such RAM devices. Both DRAMs and SRAMs include memory cells arranged in rows and columns to form an array. In operation, information in the memory cells is typically accessed during an "access cycle".

Memory cells in a DRAM include a capacitor and a transistor and are thus relatively small in size. Data can be stored in the DRAM cell by charging the capacitor. The capacitor, however, gradually discharges over time, and must be periodically recharged or refreshed. During a refresh cycle, an entire row of DRAM cell capacitors are typically recharged. Through a series of such cycles, the entire DRAM array is refreshed.

Each memory cell in an SRAM cell generally constitutes a flip-flop circuit, often including as many as six transistors. Although information in an SRAM memory cell can be accessed faster than in a DRAM cell, SRAMs typically consume more power and lack the storage density achievable with DRAMs.

A pseudo-SRAM cell is known that combines advantages of both DRAM and SRAM cells. Pseudo SRAM cells include a capacitor, but the refresh operation is "hidden" or "concealed". Exemplary Pseudo-SRAMs are described in U.S. Pat. No. 4,549,284 to Ikuzaki, entitled "Dynamic MOS Random Access Memory," U.S. Pat. No. 6,028,804 to Leung, entitled "Method and Apparatus for 1-T SRAM Compatible Memory," and U.S. Pat. No. 6,625,077 to Chen, entitled "Asynchronous Hidden Refresh of Semiconductor Memory", each of which is incorporated by reference herein.

Conventional pseudo-SRAM cells may be refreshed either by a pipeline operation or a scheduled operation. In a pipeline operation, a refresh cycle is performed prior to an access cycle, which may disadvantageously result in higher power consumption. In a scheduled operation, lower power consumption or reduced access cycle time can be achieved, but may require a more complex refresh circuit including, for example, an external refresh circuit. There is thus a need for a memory device having simpler circuitry and improved power consumption.

SUMMARY OF THE INVENTION

Accordingly, the present invention is directed to a system and a method that obviate one or more of the above-described problems due to limitations and disadvantages of the related art.

To achieve these and other advantages, and in accordance with the purpose of the invention as embodied and broadly described herein, a method for operating a memory device is provided comprising the steps of periodically generating a refresh request signal for performing a refresh operation, providing an access request signal for performing an access operation, performing the refresh operation if the refresh request signal occurs prior to the access request signal, and performing the access operation if the access request signal occurs prior to the refresh request signal.

Also in accordance with the present invention, a method is provided for operating a memory device comprising the steps of periodically generating a refresh request signal, providing a first access request signal in response to a first address transition, providing a second access request signal in response to a second address transition occurring later than the first address transition, determining whether an access cycle corresponding to the first access request signal is invalid, performing an access operation corresponding to the first access request signal if the access cycle is valid, and performing an access operation corresponding to the second access request signal if the access cycle is invalid.

Further in accordance with the present invention, a method is provided for operating a memory device comprising the steps of periodically generating a refresh request signal for performing a refresh operation, providing an access request signal for performing a write operation, activating a write enable signal in response to the access request signal, the activated write enable signal including a delay period and an access period, performing the refresh operation if the refresh request signal occurs prior to the access request signal, and performing the write operation in the access period if the access request signal occurs prior to the refresh request signal. In one aspect, the refresh operation is prohibited when the write enable signal is activated.

Still in accordance with the present invention, a method is provided for operating a memory device comprising the steps of performing periodically generating a refresh request signal, providing a first access request signal in response to a first address transition, providing a second access request signal in response to a second address transition occurring later than the first address transition, determining whether an access cycle corresponding to the first access request signal is invalid, activating a write enable signal in response to the second access request signal if the access cycle is invalid, the activated write enable signal including a delay period and an access period, and performing an access operation corresponding to the second access request signal if the access cycle is invalid.

Yet still in accordance with the present invention, a system is configured to operate a memory device that comprises a refresh generator for periodically generating a refresh request signal for performing a refresh operation, an address buffer for providing an access request signal for performing an access operation, and a controller for performing the refresh operation if the refresh request signal occurs prior to the access request signal, and performing the access operation if the access request signal occurs prior to the refresh request signal.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE EMBODIMENTS

Consistent with an aspect of the present invention, a pseudo SRAM device includes a relatively simple refresh circuit having reduced power consumption.

Reference will now be made in detail to the present embodiment of the invention, an example of which is illustrated in the accompanying drawings. Wherever possible, the same reference numbers will be used throughout the drawings to refer to the same or like parts.

Figure 1:
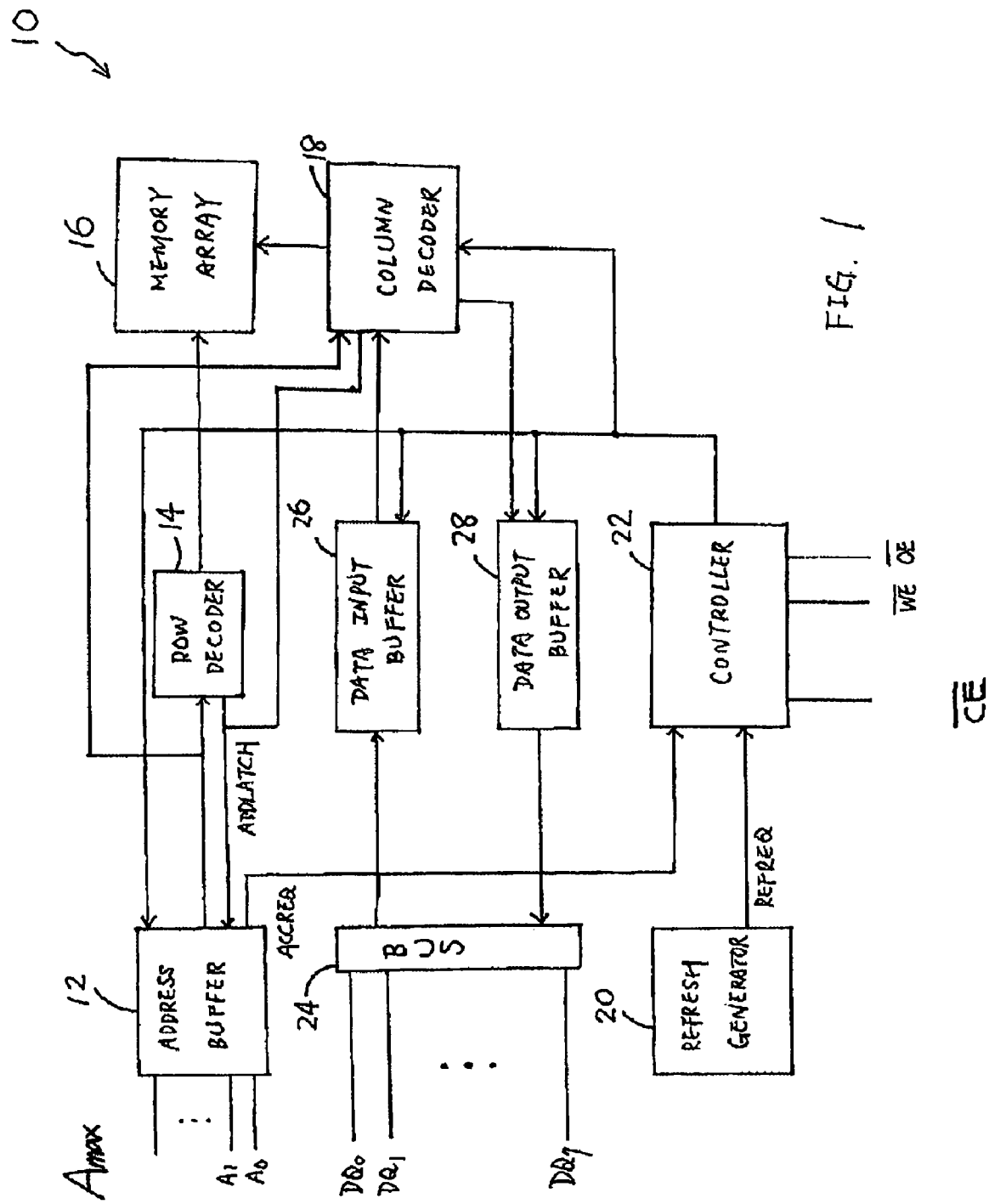
FIG. 1 is a block diagram of a memory system in accordance with an embodiment of the present invention.

FIG. 1 is a block diagram of a memory system 10 in accordance with an embodiment of the present invention. Memory system 10 includes an address buffer 12, a row decoder 14, a memory array 16, a column decoder 18, a refresh generator 20 and a controller 22. Address buffer 12 receives address signals $A_0, A_1 \ldots A_{Max}$ (collectively "ADD") designating a particular cell in memory array 16 to which data is to be written or from which data is to be read. Address buffer 12 is coupled with row decoder 14, controller 22, and column decoder 18. Row decoder 14 is coupled with address buffer 12, memory array 16, and column decoder 18.

During an access cycle, address buffer 12 provides an access request signal ACCREQ to controller 24 to initiate reading from or writing to one or more cells in memory array 16. In addition, address buffer 12 provides address signals ADD to row decoder 14 and column decoder 18 for decoding into row and column addresses, respectively. Row decoder 14 and column decoder 18 latch one or more of address signals $A_0, A_1 \ldots A_{Max}$ and supplies signal ADDLATCH to address buffer 12 to indicate that such latching has occurred.

Data is written to one or more cells in memory array 16 during a write cycle. In an initial phase of the write cycle, data (represented by $DQ_0, DQ_1 \ldots DQ_7$ in FIG. 1) is supplied to data input buffer 26 through bus 24, and in a latter part of the write cycle, data is transferred from data input buffer 26 to memory array 16. Moreover, data stored in memory array 16 is read out during a read cycle through a data output buffer 28 and bus 24. In particular, data is first output from memory array 16 to data output buffer 28 during first part of the read cycle, and then output through bus 24 during a later part of the cycle.

Refresh generator 20 periodically supplies a refresh request signal REFREQ to controller 22 to initiate a refresh operation. Following the refresh request signal, cells in memory array 16 are refreshed during the refresh cycle, in order to ensure adequate recharging of cell capacitors in a row of cells of memory array 16.

Controller 22 controls refresh and access operations in response to chip enable signal $\overline{CE}$, write enable signal $\overline{WE}$ and an output enable signal $\overline{OE}$. In particular, controller 22 determines whether the access request ACCREQ or the refresh request REFREQ has priority. If controller 22 receives access request ACCREQ before refresh request REFREQ, signal ACCREQ has priority and system 10 performs an access operation. However, if periodic refresh request REFREQ is received before access request ACCREQ, system 10 performs a refresh operation.

Figure 2A:
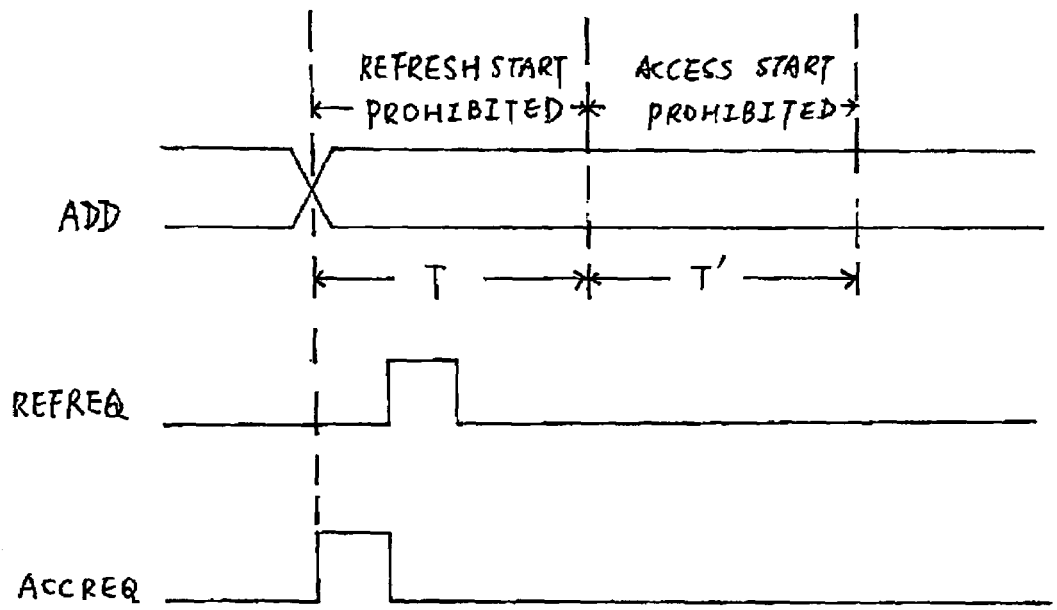
FIGS. 2A and 2B are timing diagrams in connection with a method for refreshing memory cells in accordance with an embodiment of the present invention.
Figure 2B:
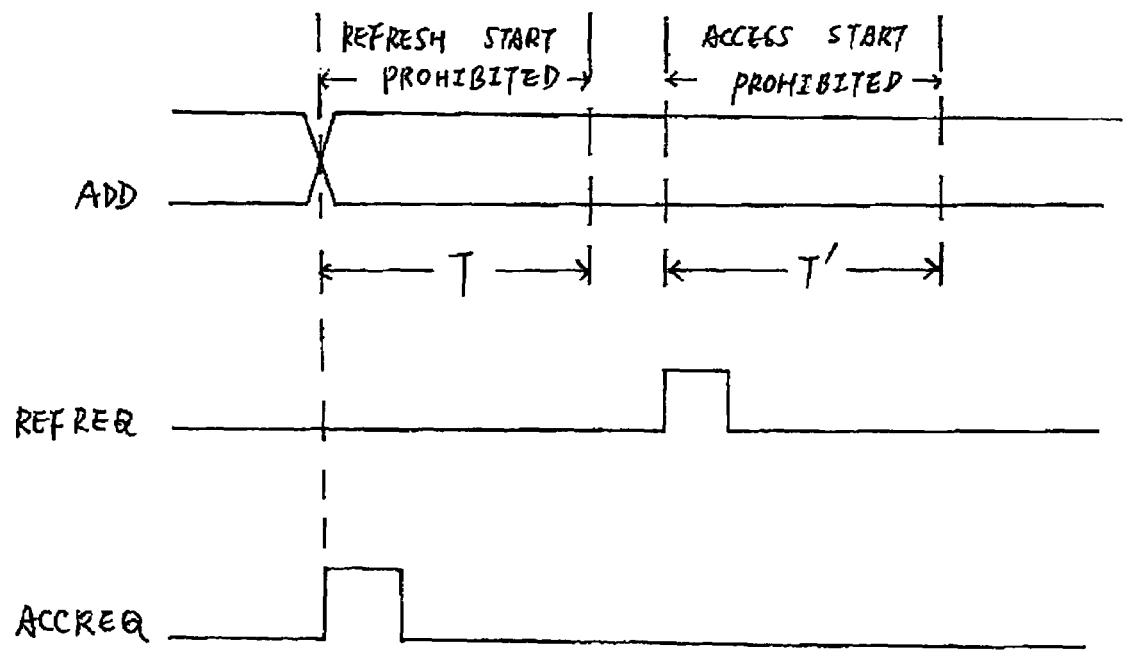

FIGS. 2A and 2B are timing diagrams in connection memory cell refreshing method in accordance with an aspect of the present invention. Referring to FIG. 2A, an access request signal ACCREQ is generated by address buffer 12 in response to a transition of address signal ADD. ACCREQ is received by controller 22 to thereby initiate an access operation. A "refresh-start-prohibited" period during which no refreshing occurs also begins upon receipt of access request signal ACCREQ. During the "refresh-start-prohibited" period, however, refresh generator 20 can output refresh request signal REFREQ, but refresh operations are delayed until completion of the access operation.

Refresh operations take place during an "access-start-prohibited" period, during which access operations do not occur until the completion of the refresh operation. In FIGS. 2A and 2B, T represents the duration of the "refresh-start-prohibited" period, which is measured from the leading edge of the ACCREQ pulse until completion of the access operation. The time period during which refresh operations can occur is denoted T' in FIGS. 2A and 2B.

Referring to FIG. 2B, an access request signal ACCREQ occurs prior to a refresh request signal REFREQ, and the refresh request signal REFREQ occurs after an access operation has been completed. The total access time for the access operation is approximately equal to the array access time T.

Figure 3A:
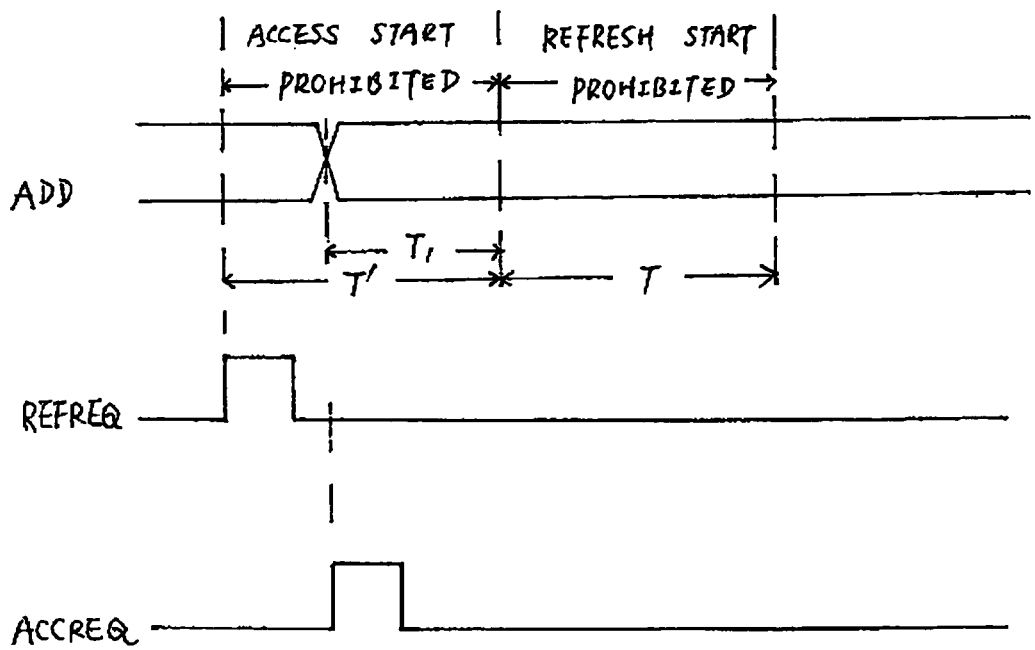
FIGS. 3A and 3B are timing diagrams in connection with a method for refreshing memory cells in accordance with another embodiment of the present invention.
Figure 3B:
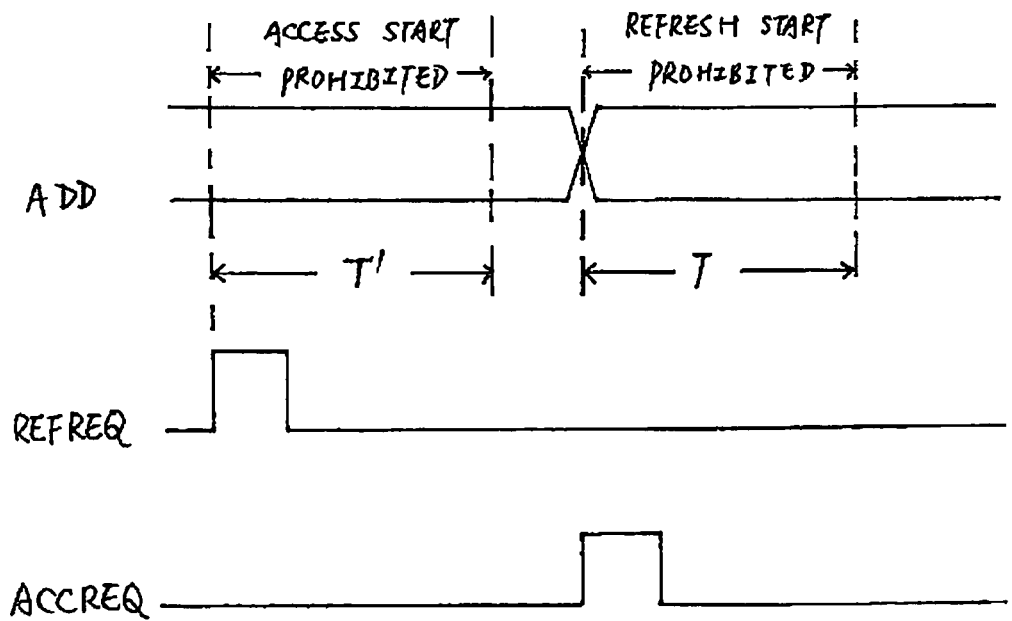

FIGS. 3A and 3B illustrate timing diagrams associated with a method for refreshing memory cells in accordance with another aspect of the present invention. Referring to FIG. 3A, a refresh request signal REFREQ occurs prior to an access request signal ACCREQ, and a refresh operation and an access-start-prohibited period begin with refresh request signal REFREQ. During the access-start-prohibited period, if a transition occurs in address signal ADD to thereby output access request signal ACCREQ, an access operation corresponding to the access request signal ACCREQ is delayed until the pending refresh operation is completed. The access operation will begin, however, during a "refresh-start-prohibited" period. Access operations can take place during a time period equal to $T_1+T$, wherein $T_1$ is a period calculated from a time the access request signal ACCREQ occurs to a point at which the refresh operation is completed. In addition, refresh operations can occur for a time period substantially equal to refresh time T'. In one aspect, the access request signal ACCREQ occurs immediately after the refresh request signal REFREQ, whereby $T_1$ is approximately equal to T', and the total access time T'+T.

In FIG. 3B, a refresh request signal REFREQ occurs prior to access request signal ACCREQ, and access request signal ACCREQ occurs after completion of a refresh operation. The total access time for the access operation is approximately equal to the array access time T.

Figure 4A:
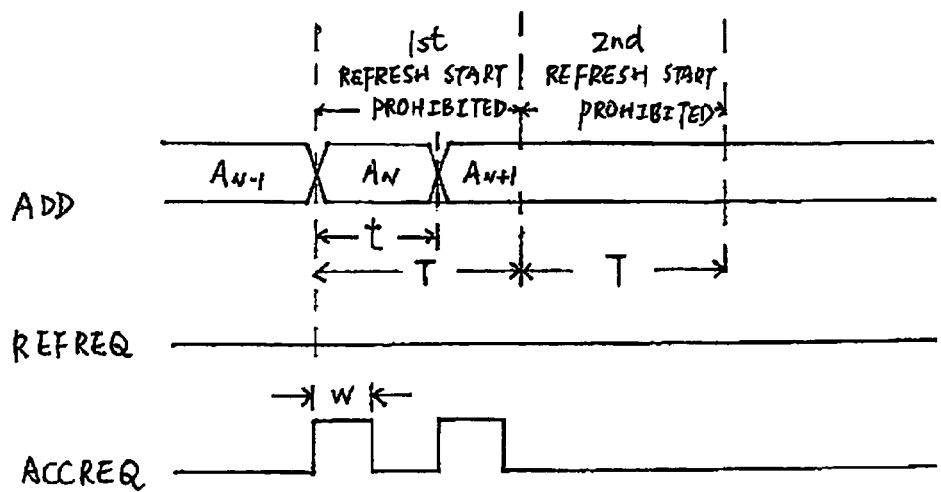
FIGS. 4A, 4B and 4C are timing diagrams in connection with a method for refreshing memory cells in accordance with yet another embodiment of the present invention.
Figure 4B:
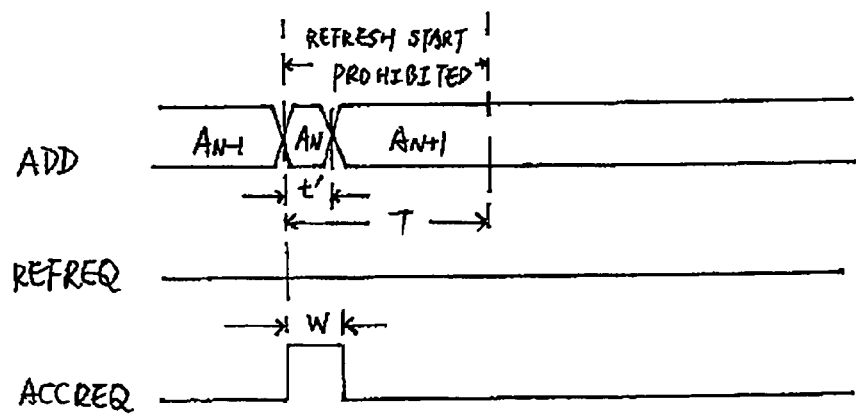
Figure 4C:
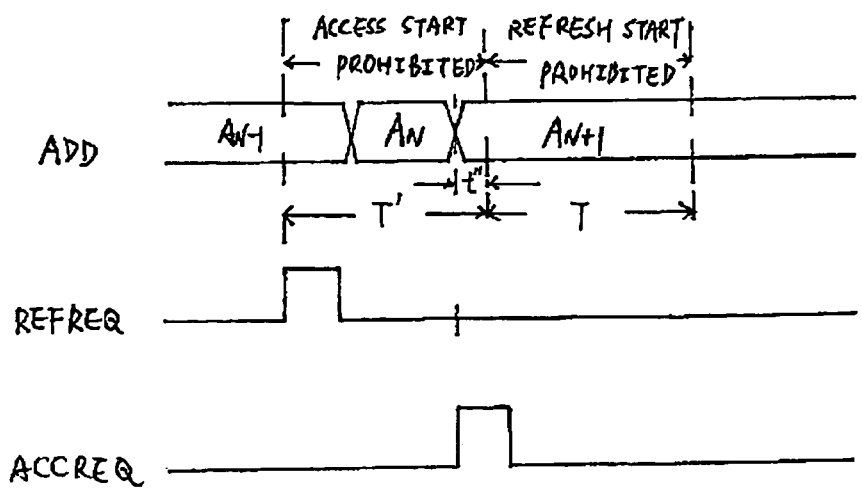

FIGS. 4A, 4B and 4C illustrate timing diagrams in connection with a method for refreshing memory cells in accordance with a further aspect of the present invention. In FIG. 4A, a first address transition and a second address transition occur between address cycles $A_{N-1}$ and $A_N$, and $A_N$ and $A_{N+1}$, respectively. A first refresh-start-prohibited period and a second refresh-start-prohibited period respectively correspond to the first and second address transitions. A time period t between the first and second address transitions is greater than a pulse width w of the address request signal ACCREQ, but less than access time T and refresh time T'. In an embodiment according to the present invention, w is approximately 8 to 10 nanoseconds (ns), T+T' is approximately 50 to 100 ns.

Typically, if t is less than T+T', address cycle $A_N$ does not comply with an operation specification and is considered invalid. Accordingly, an access operation associated with address cycle $A_N$ is aborted. In this instance, however, an access operation associated with address cycle $A_{N+1}$, not $A_N$, is required by a user of system 10. The total access time associated with address cycle $A_{N+1}$ is approximately 2T−t.

Referring to FIG. 4B, a time period t' between the first and second address transitions is less than w. As a result, address cycle $A_N$ is not latched and hence not performed by system 10. An address corresponding to address cycle $A_{N+1}$, however, is required by a user of system 10, and the total access time for performing the address cycle $A_{N+1}$ in this instance is approximately T−t'.

Referring to FIG. 4C, a refresh request signal REFREQ occurs prior to an access request signal ACCREQ, and a refresh operation corresponding to the refresh request signal REFREQ is then performed. Since the refresh time T' overlaps with address cycle $A_N$, address cycle $A_N$ is not performed. The total access time for performing the address cycle $A_{N+1}$ is approximately T+t", wherein t" is a period calculated from a time the access request signal ACCREQ occurs to a time the refresh operation is completed.

Figure 5A:
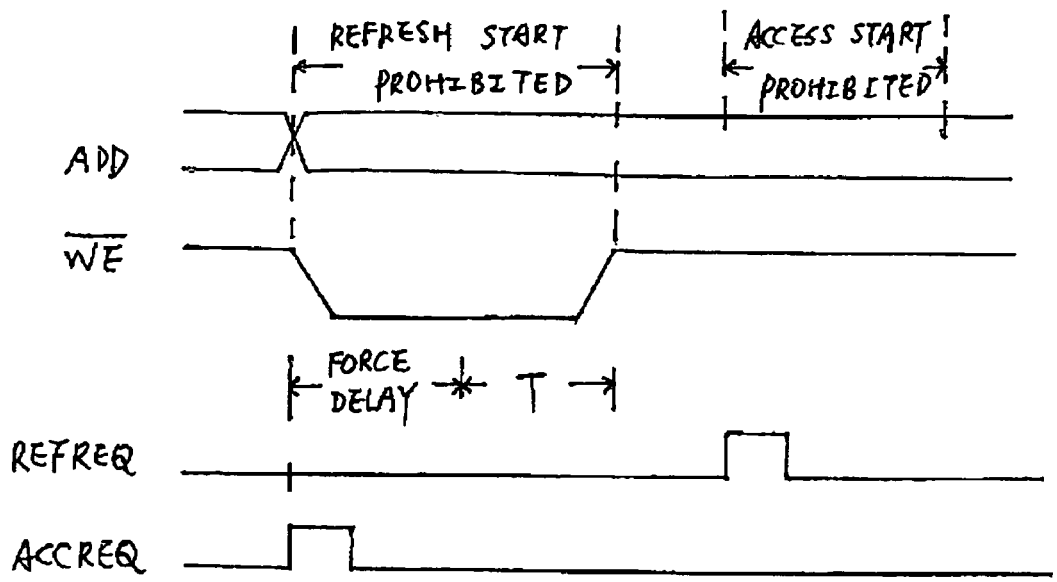
FIGS. 5A and 5B are diagrams are timing diagrams in connection with a method for refreshing memory cells in accordance with still another embodiment of the present invention.
Figure 5B:
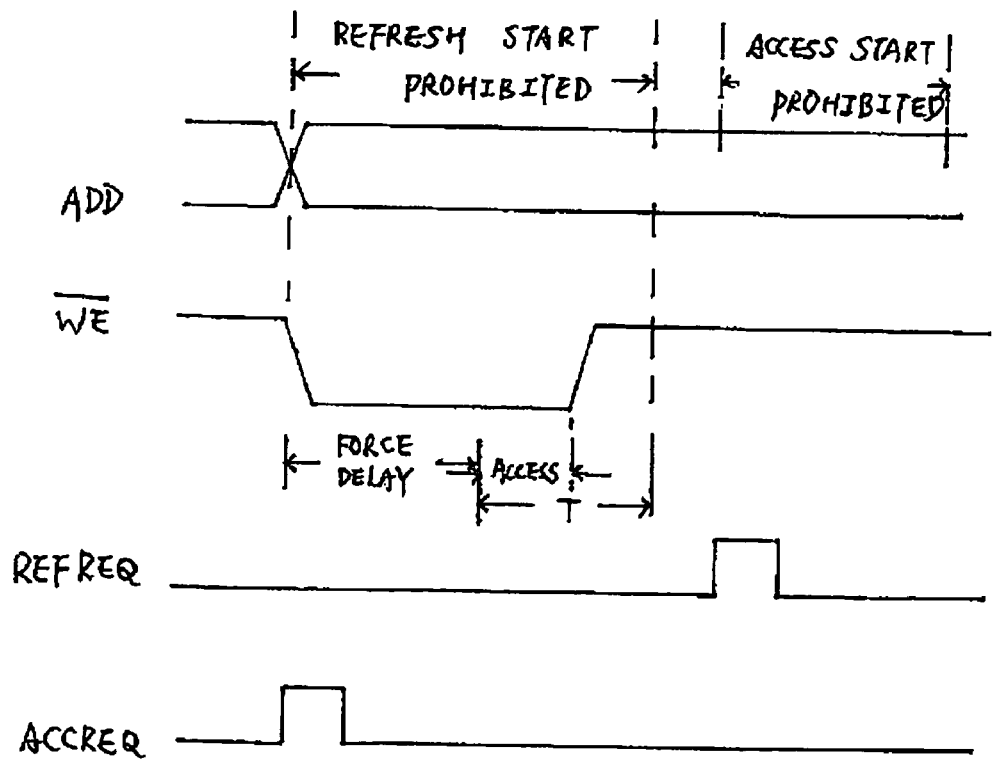

FIGS. 5A and 5B are timing diagrams in connection with a further aspect of the present invention that prevents invalid write operations. Although an improper read operation has no effect on information stored in an SRAM, an improper write operation can corrupt stored data. Here, a forced delay period is created to prevent such improper write operations. In particular, as shown in FIG. 5A, an access request signal ACCREQ occurs prior to refresh request signal REFREQ, A refresh-start-prohibited period and a low active write enable signal $\overline{WE}$ are generated in response to the access request signal ACCREQ, but the access operation does not begin until after the forced delay period, thereby ensuring that any invalid write operation preceding the current access cycle is not performed. In the embodiment shown in FIG. 5A, the total access time for performing the access operation is approximately the forced delay time plus the access time T.

Referring to FIG. 5B, an access request signal ACCREQ occurs prior to a refresh request signal REFREQ, and the active write enable signal $\overline{WE}$ includes a forced delay period and an access period which is shorter than T. The access operation period is automatically extended to have a time length of T corresponding to the access request signal ACCREQ, and thus the total access time for performing the access operation is still the forced delay period plus the access period.

Figure 6A:
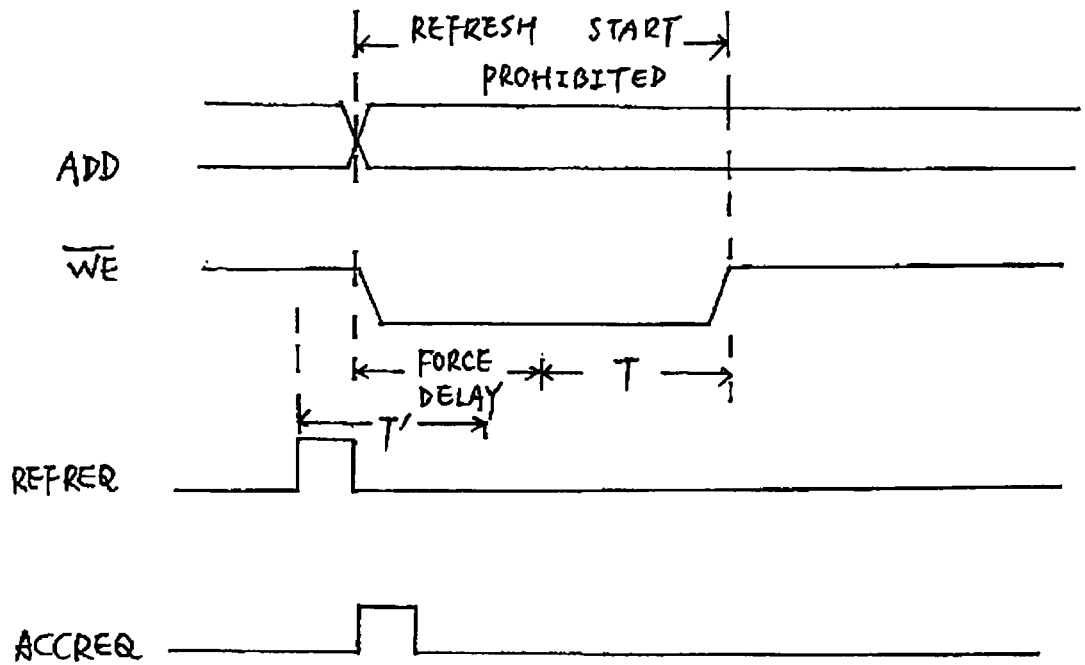
FIGS. 6A and 6B are timing diagrams in connection with a method for refreshing memory cells in accordance with an embodiment of the present invention.
Figure 6B:
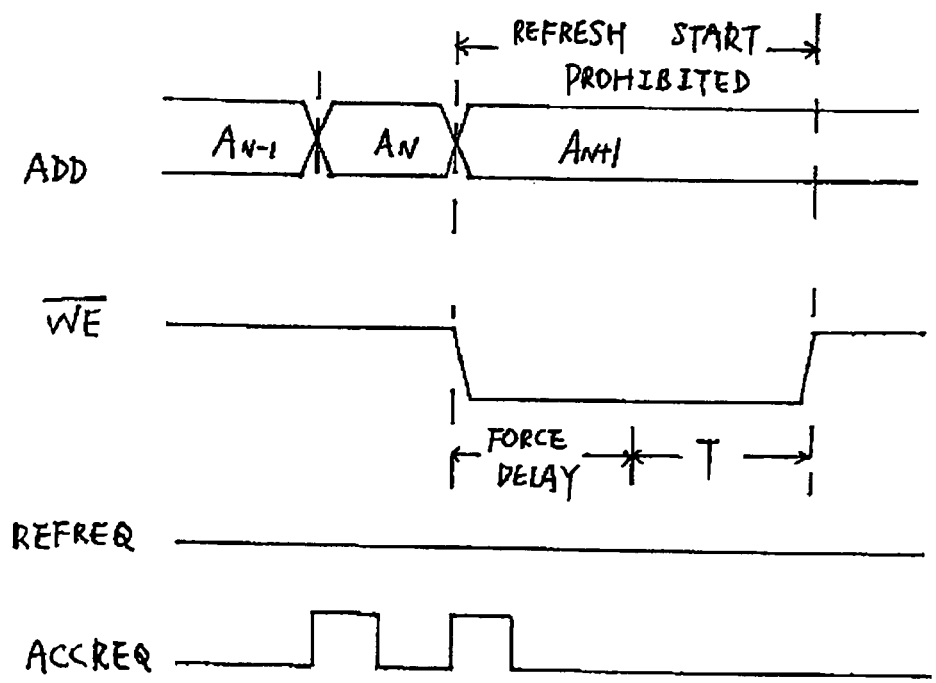

FIGS. 6A and 6B illustrate timing diagrams consistent with an additional aspect of the present invention. In FIG. 6A, a refresh request signal REFREQ occurs prior to an access request signal ACCREQ. Refresh time T', during which a refresh operation is performed, is initiated by signal REFREQ. As further shown in FIG. 6A, time period T' overlaps the force delay period. Thus, the total access time for performing the access operation is approximately the forced delay period plus the access period T.

In FIG. 6B, a first address transition occurs between cycles $A_{N-1}$ and $A_N$, and a second transition occurs between $A_N$ and $A_{N+1}$. In this example, address cycle $A_N$ is invalid for failure to comply with an operation specification cycle time. In addition, an ACCREQ signal and the write enable signal $\overline{WE}$ become active in response to the second access request signal. The total access time for performing the access operation $A_{N+1}$ (corresponding to the second access request signal) is approximately the forced delay period plus the access period T.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

We claim:

1. A method for operating a memory device, comprising:
periodically generating a refresh request signal for performing a refresh operation;
providing an access request signal for performing a write operation;
activating a write enable signal in response to the access request signal, the activated write enable signal including a forced delay period and an access period;
performing the refresh operation if the refresh request signal occurs prior to the access request signal; and
performing the write operation in the access period after the forced delay period if the access request signal occurs prior to the refresh request signal;
wherein the refresh start is prohibited when the write enable signal is activated, and the forced delay period is created to prevent improper write operations.

2. The method of claim 1, wherein a refresh time for performing the refresh operation overlaps with the forced delay period.

3. The method of claim 1 wherein the access period is extended to perform the write operation.

4. The method of claim 1, comprising a step of determining an access time for performing the write operation from a time the access request signal occurs to a time the write operation is completed.

5. A method for operating a memory device, comprising:
periodically generating a refresh request signal;
providing a first access request signal in response to a first address transition;
providing a second access request signal in response to a second address transition occurring later than the first address transition;
determining whether an access cycle corresponding to the first access request signal is invalid;
activating a write enable signal in response to the second access request signal if the access cycle is invalid, the activated write enable signal including a forced delay period and an access period; and
performing an access operation corresponding to the second access request signal after the forced delay period if the access cycle is invalid;
wherein the forced delay period if the created to prevent improper write operations.

6. The method of claim 5 comprising performing a refresh operation in response to the refresh request signal if the refresh request signal occurs prior to the first access request signal.

7. The method of claim 6 wherein the refresh operation is prohibited when the write enable signal is activated.

8. The method of claim 5, wherein the access cycle is invalid if a time period between the first address transition and the second address transition is less than an access time for performing an access operation plus a refresh time for performing a refresh operation.

9. The method of claim 5, further comprising a step of determining an access time for performing the write operation from a time the second access request signal occurs to a time the write operation is completed.

* * * * *

UNITED STATES PATENT AND TRADEMARK OFFICE
CERTIFICATE OF CORRECTION

| | |
|---|---|
| PATENT NO. | : 7,433,996 B2 |
| APPLICATION NO. | : 10/880581 |
| DATED | : October 7, 2008 |
| INVENTOR(S) | : Hong-Gee Fang et al. |

Page 1 of 1

It is certified that error appears in the above-identified patent and that said Letters Patent is hereby corrected as shown below:

In claim 5, column 6, line 66, "if the" should read --is--.

Signed and Sealed this

Thirty-first Day of March, 2009

JOHN DOLL
*Acting Director of the United States Patent and Trademark Office*